(12) United States Patent
Tani et al.

(10) Patent No.: US 6,368,893 B1
(45) Date of Patent: Apr. 9, 2002

(54) METHOD OF FABRICATING SEMICONDUCTOR DEVICE

(75) Inventors: Takayuki Tani; Haruo Hyoudo; Takao Shibuya, all of Oizuma-Machi (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 0 days.

(21) Appl. No.: 09/501,262

(22) Filed: Feb. 9, 2000

(30) Foreign Application Priority Data

Feb. 9, 1999 (JP) ............................................ 11-031387

(51) Int. Cl.[7] ........................ H01L 21/44; H01L 21/48; H01L 21/50
(52) U.S. Cl. ........................ 438/106; 438/114; 438/127
(58) Field of Search ................................ 438/106, 114, 438/127

(56) References Cited

U.S. PATENT DOCUMENTS 5,882,956 A * 3/1999 Umehara et al.
5,888,606 A * 3/1999 Senoo et al.
6,080,602 A * 6/2000 Tani et al.
6,110,755 A * 8/2000 Muramatsu et al.
6,117,705 A * 9/2000 Glenn et al.
6,124,152 A * 9/2000 Yim

OTHER PUBLICATIONS

Tummala et al., Microelectronics Packaging Handbook, vol. 2, pp. 398–399, 407–409; vol. 3, pp. 252–253, 1997.*

* cited by examiner

Primary Examiner—John F. Niebling
Assistant Examiner—Josetta I. Jones
(74) Attorney, Agent, or Firm—Wenderoth, Lind & Ponack, L.L.P.

(57) ABSTRACT

A method of fabricating a semiconductor device including preparing a board with a plurality of device carrier areas thereon and an electrode pattern serving as external electrodes on a back of the board. Semiconductor chips are fixed respectively to the device carrier areas. The semiconductor chips fixed to the device carrier areas are covered with a common resin layer. A round surface of the common resin layer is flattened into a flat and horizontal surface, and a dicing sheet is applied to the flat and horizontal surface of the common resin layer with electrode pattern facing upwardly. The board and the common resin layer are separated into segments including the device carrier areas thereby to produce individual semiconductor devices by dicing from the back of the board.

5 Claims, 8 Drawing Sheets

US 6,368,893 B1

METHOD OF FABRICATING SEMICONDUCTOR DEVICE

BACKGROUND OF THE INVENTION

1. Field of the Invention

The present invention relates to a method of fabricating a semiconductor device, and more particularly to a method of fabricating a semiconductor device having a reduced package contour, a reduced mounting area, and a reduced cost.

2. Description of the Related Art

In the fabrication of semiconductor devices, it has been customary to separate semiconductor chips from a wafer by dicing, fixing the semiconductor chips to a lead frame, sealing the semiconductor chips fixed to the lead frame with a mold and a synthetic resin according to a transfer molding process, and dividing the sealed semiconductor chips into individual semiconductor devices. The lead frame comprises a rectangular or hooped frame. A plurality of semiconductor devices are simultaneously sealed in one sealing process.

FIG. 1 of the accompanying drawings illustrates a conventional transfer molding process. In the conventional transfer molding process, a lead frame 2 to which semiconductor chips 1 are fixed by die bonding and wire bonding is placed in a cavity 4 defined by upper and lower molds 3A, 3B. Epoxy resin is then poured into the cavity 4 to seal the semiconductor chips 1. After the transfer molding process, the lead frame 2 is cut off into segments containing the respective semiconductor chips 1, thus producing individual semiconductor devices. For more details, reference should be made to Japanese laid-open patent publication No. 05-129473, for example.

Actually, as shown in FIG. 2 of the accompanying drawings, the lower mold 3B has a number of cavities 4a–4f, a source 5 of synthetic resin, a runner 6 connected to the source 5 of synthetic resin, and gates 7 for pouring the synthetic resin from the runner 6 into the cavities 4a–4f. The cavities 4a–4f, the source 5 of synthetic resin, the runner 6, and the gates 7 are all in the form of recesses and grooves define (in the surface of the lower mold 3B. If the lead frame 2 is of a rectangular shape, then ten semiconductor chips 1 are mounted on one lead frame, and the lower mold 3B has ten cavities 4, ten gates 7, and one runner 6 per lead frame. The entire lower mold 3B has as many as cavities 4 as necessary for twenty lead frames 2, for example.

FIG. 3 of the accompanying drawings shows a semiconductor device fabricated by the conventional transfer molding process. As shown in FIG. 3, a semiconductor chip 1 containing components such as transistors is fixedly mounted on an island 8 of a lead frame by a bonding material 9 such as solder. The semiconductor chip 1 has electrode pads connected to leads 10 by wires 11, and has its peripheral portions covered with a molded body 12 of synthetic resin which is defined in shape by the cavity 4. The leads 10 have respective distal ends projecting out of the molded body 12 of synthetic resin.

In the conventional semiconductor package shown in FIG. 3, since the leads 10 for connection to external circuits project from the molded body 12 of synthetic resin, dimensions of the package that extend up to the projecting distal ends of the leads 10 need to be considered as covering a mounting area of the package. Therefore, the mounting area of the package is much larger than the contour of the molded body 12 of synthetic resin.

Furthermore, according to the conventional transfer molding process, since the molded body 12 of synthetic resin is hardened while it is being placed under pressure, the synthetic resin is also hardened in the runner 6 and the gates 7, and the hardened synthetic resin in the runner 6 and the gates 7 has to be thrown away. Because the gates 7 are required for respective individual semiconductor devices to be fabricated, the synthetic resin is not utilized highly efficiently, but the number of semiconductor devices that can be fabricated is small relatively to the amount of synthetic resin consumed.

SUMMARY OF THE INVENTION

It is therefore an object of the present invention to provide a semiconductor device having a small size with relatively small mounting area.

Another object of the present invention is to provide a method of fabricating a semiconductor device relatively inexpensively.

According to the present invention, there is provided a method of fabricating a semiconductor device, comprising the steps of preparing a board with a plurality of device carrier areas thereon, fixing semiconductor chips respectively to the device carrier areas, covering the semiconductor chips fixed to the device carrier areas with a common resin layer, flattening a surface of the common resin layer, applying a dicing sheet to the flattened surface of the common resin layer, and separating the board and the common resin layer into segments including the device carrier areas thereby to produce individual semiconductor devices by dicing from a back of the board.

The method may further comprise the step of placing an electrode pattern serving as external electrodes of the semiconductor chips on the back of the board, the electrode pattern being spaced inwardly from dicing lines along edges of the segments so as to be kept out of contact with a dicing blade along the dicing lines.

The above and other objects, features, and advantages of the present invention will become apparent from the following description when taken in conjunction with the accompanying drawings which illustrate a preferred embodiment of the present invention by way of example.

DETAILED DESCRIPTION OF THE PREFERRED EMBODIMENT

A method of fabricating a semiconductor device according to the present invention will be described below in terms of successive steps thereof with reference to FIGS. 4 through 8A, 8B.

1st Step

Figure 1:
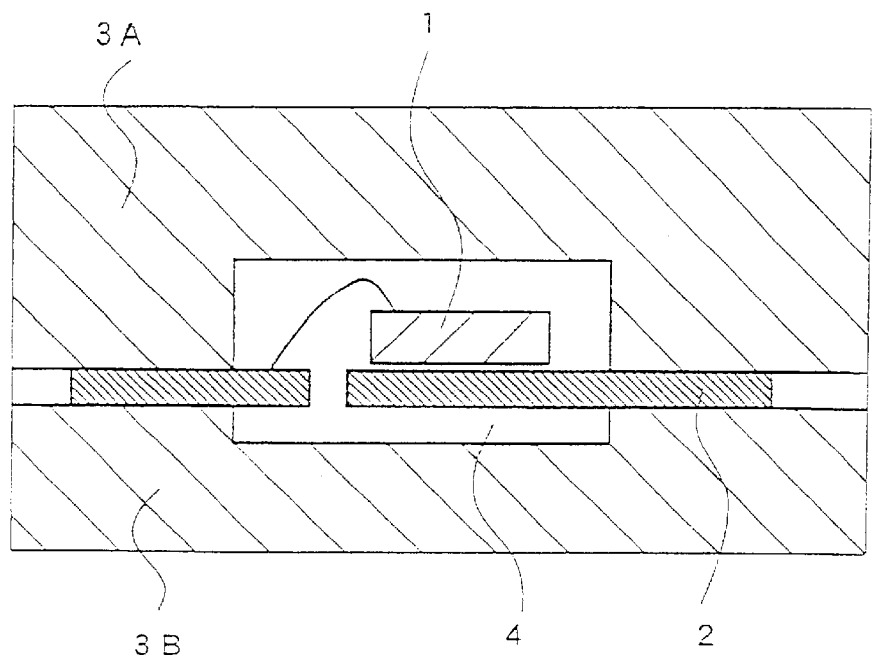
FIG. 1 is a cross-sectional view illustrative of a conventional transfer molding process.
Figure 2:
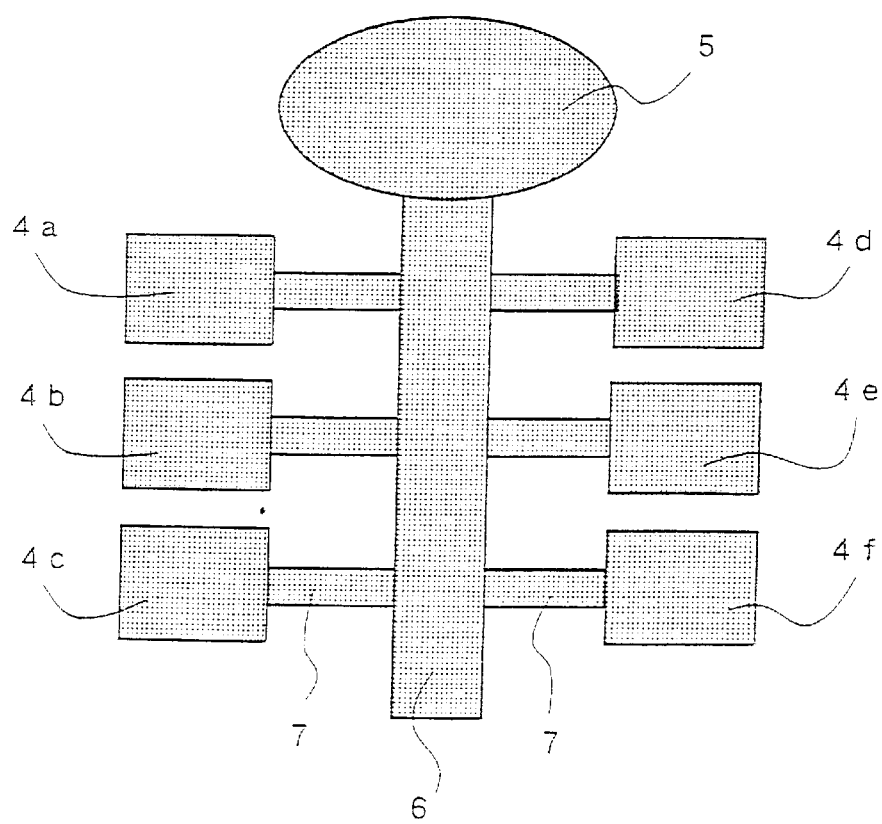
FIG. 2 is a plan view illustrative of the conventional transfer molding process.
Figure 3:
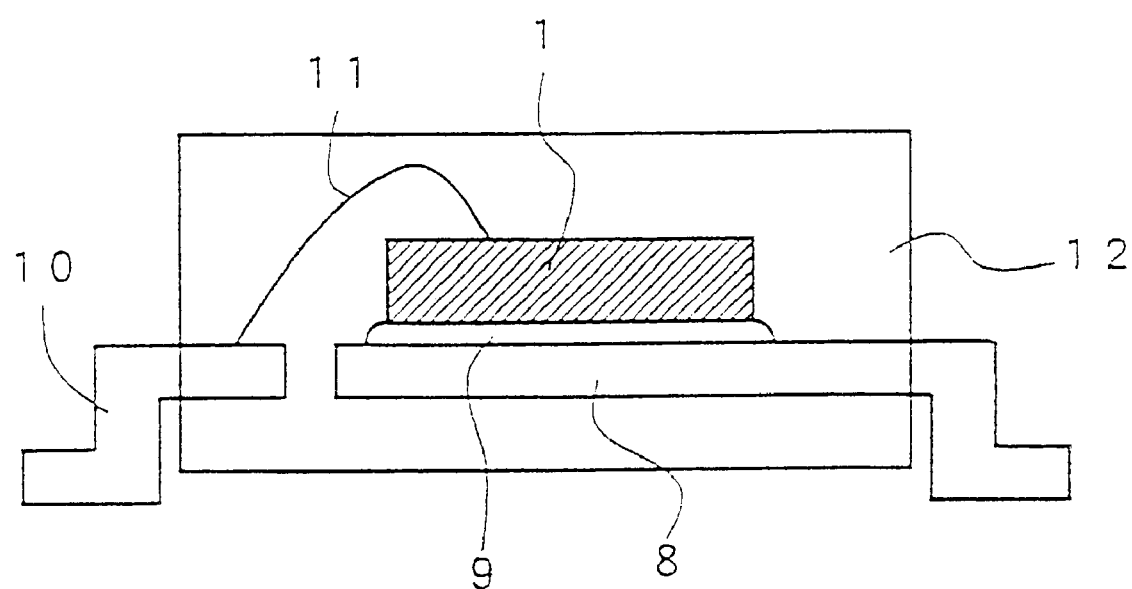
FIG. 3 is a cross-sectional view of a semiconductor device fabricated by the conventional transfer molding process.
Figure 4:
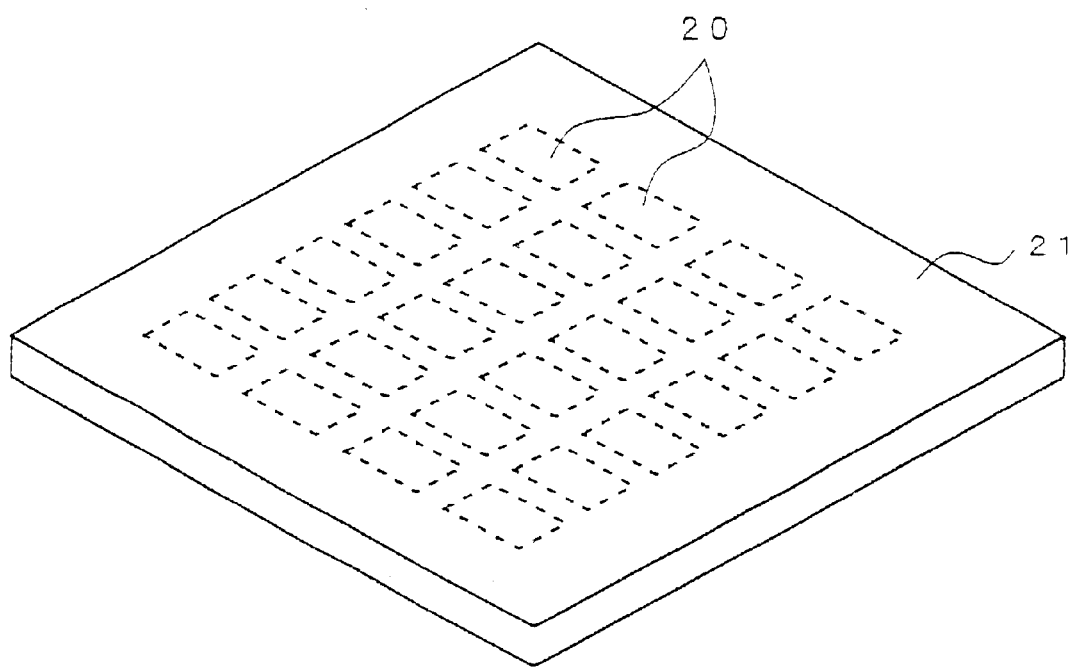
FIG. 4 is a perspective view illustrative of a method of fabricating a semiconductor device according to the present invention.

First, as shown in FIG. 4, a large-size board 21 having a two-dimensional matrix of 100 device carrier areas 20 each corresponding to a semiconductor device is prepared. The board 21 comprises one or more insulating boards of ceramics, glass epoxy, or the like, and has a total thickness ranging from 200 to 350 µm to provide a mechanical strength large enough to withstand stresses imposed during the fabrication process.

An electrically conductive pattern made of printed metal paste of tungsten or the like and electroplated gold is formed on the surface of each of the device carrier areas 20. An electrode pattern of electrodes for external connection is formed on the back of the board 21.

Figure 5A:
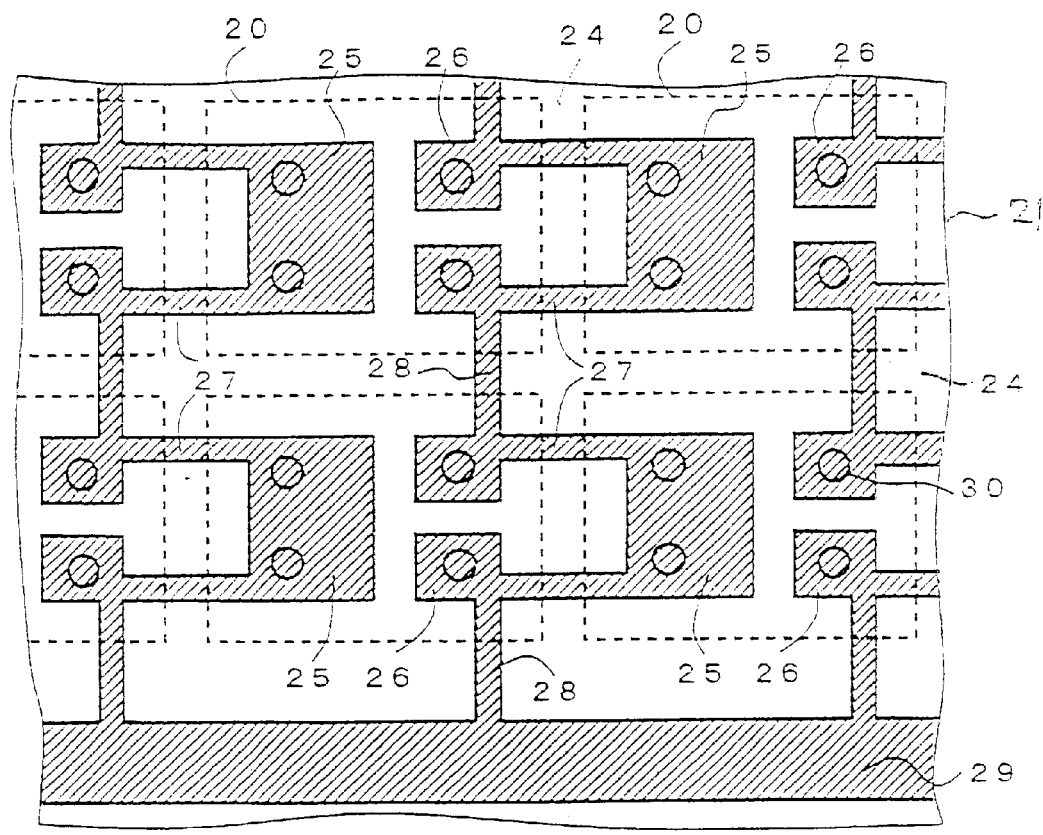
FIGS. 5A and 5B are plan and cross-sectional views, respectively, illustrative of the method of fabricating a semiconductor device according to the present invention.
Figure 5B:
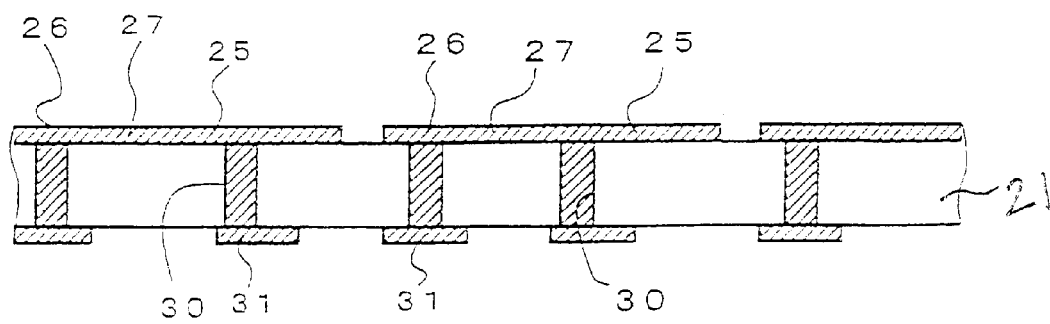

FIG. 5A shows in plan an electrically conductive pattern formed on the face of the board 21, and FIG. 5B shows a cross section of the board 21.

Each of the device carrier areas 20, enclosed by the dotted lines, has a rectangular shape having a longer side which is 1.0 mm long and a shorter side which is 0.8 mm long. The device carrier areas 20 are arranged in a two-dimensional matrix, and adjacent ones of the device carrier areas 20 are spaced from each other by a distance ranging from 20 to 50 µm. The spacing between adjacent ones of the device carrier areas 20 serves as a dicing line 24 in a subsequent step. In each of the carrier areas 20, the electrically conductive pattern provides an island 25 and leads 26. The electrically conductive pattern segments in the device carrier areas 20 are identical in shape to each other.

The island 25 is a region where a semiconductor chip is to be mounted, and the leads 26 are to be connected by wires to electrode pads of a semiconductor chip on the island 25. Two first joint arms 27, each having a width of 0.1 mm, for example, much smaller than the width of the island 25, extend continuously from the island 25 across the dicing line 24 to the leads 26 of an adjacent device carrier area 20. Two second joint arms 28 extend continuously from the respective leads 26 in directions perpendicular to the first joint arms 27 across the dicing lines 24 to the leads 26 of adjacent device carrier areas 20. Some of the second joint arms 28 are connected to a common joint 29 extending around the device carrier areas 20. The first and second joint arms 27, 28 which are thus extended and connected electrically connect the islands 25 and the leads 26 to each other.

Figure 6:
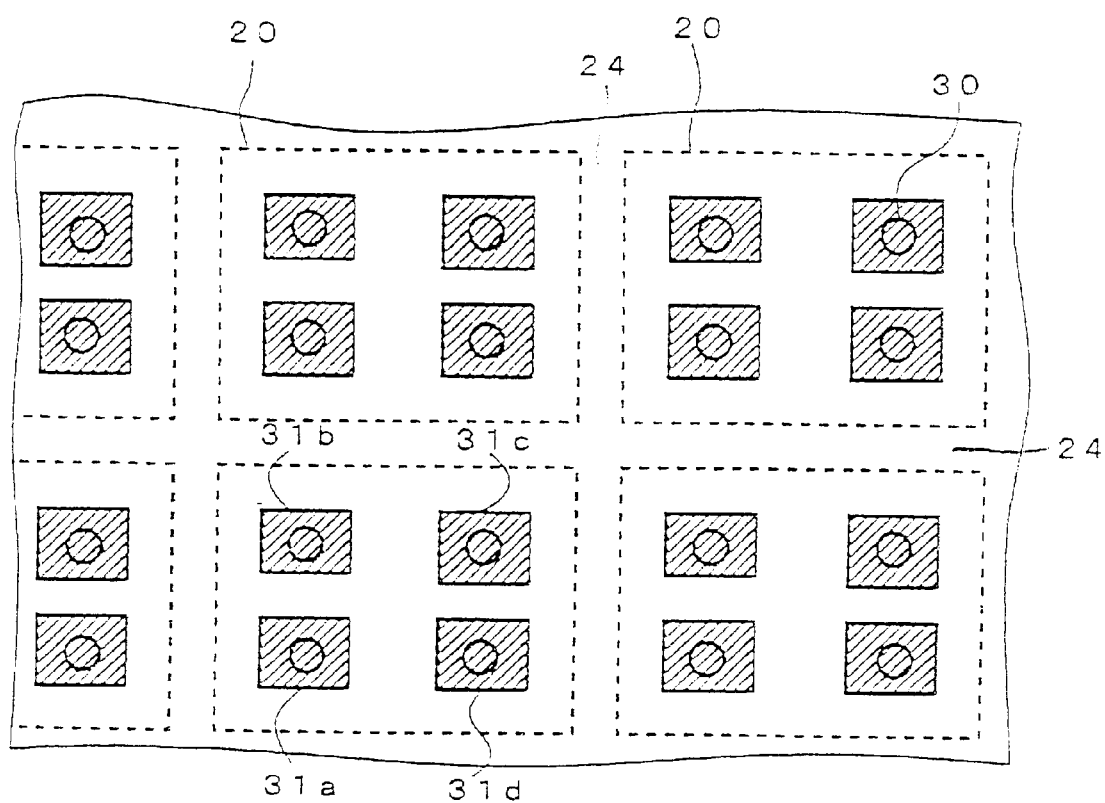
FIG. 6 is a plan view illustrative of the method of fabricating a semiconductor device according to the present invention.

As shown in FIG. 5B, the board 21 has through holes 30 defined in each of the device carrier areas 20. An electrically conductive material such as tungsten is filled in the through holes 30. External electrodes 31 are formed on the back of the board 21 in alignment with the respective FIG. 6 shows in plan the reverse side of the board 21, illustrating a pattern of the external electrodes which are designed by 31a, 31b, 31c, 31d. The external electrodes 31a, 31b, 31c, 31d, which are independent of each other, are spaced or retracted a distance ranging from 0.05 to 0.1 mm inwardly from the edges of each of the device carrier areas 20, and electrically connected to the common joint 29 via the through holes 30. With this arrangement, a plated layer of gold of the electrically conductive pattern can be formed by the electroplating process which employs the electrically conductive pattern as one electrode. Only the first and second joint arms 27, 28 of the narrow width extend across the dicing lines 24.

Figure 7A:
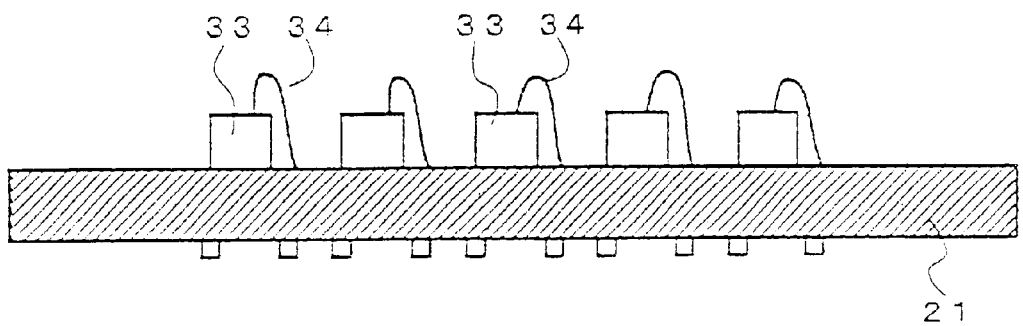
FIGS. 7A, 7B, and 7C are cross-sectional views illustrative of the method of fabricating a semiconductor device according to the present invention.

2nd Step: (FIG. 7A)

Semiconductor chips 33 are mounted on the respective device carrier areas 20 of the common board 21 with the plated layer of gold, by die bonding and wire bonding. Specifically, the semiconductor chips 33 are fixed to the surfaces of the islands 25 by an adhesive such as an Ag paste, and the electrode pads of the semiconductor chips 33 are connected to the leads 26 by wires 34. The semiconductor chips 33 comprise three-terminal active components such as bipolar transistors, power MOSFETs, or the like. If the semiconductor chips 33 comprise bipolar transistors, then the external electrodes 31a, 31b serve as collector terminals, and the external electrodes 31c, 31d serve as base and emitter electrodes, respectively.

Figure 7B:
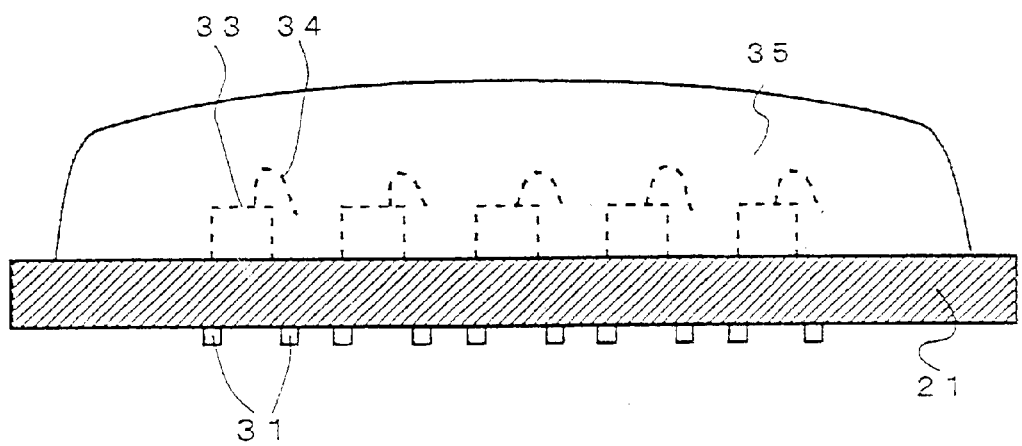

3rd Step: (FIG. 7B)

A predetermined amount of liquid epoxy resin is dropped from a dispenser (not shown) delivered to a position over the board 21 by potting to cover all the semiconductor chips 33 with a common resin layer 35. For example, if 100 semiconductor chips 33 are mounted on one board 21, then all the 100 semiconductor chips 33 are covered with the common resin layer 35. The liquid epoxy resin may be CV576AN (manufactured by Matsushita Electric Works, Ltd.). Since the dropped liquid epoxy resin is relatively highly viscous and has a surface tension, the common resin layer 35 has a round surface.

Figure 7C:
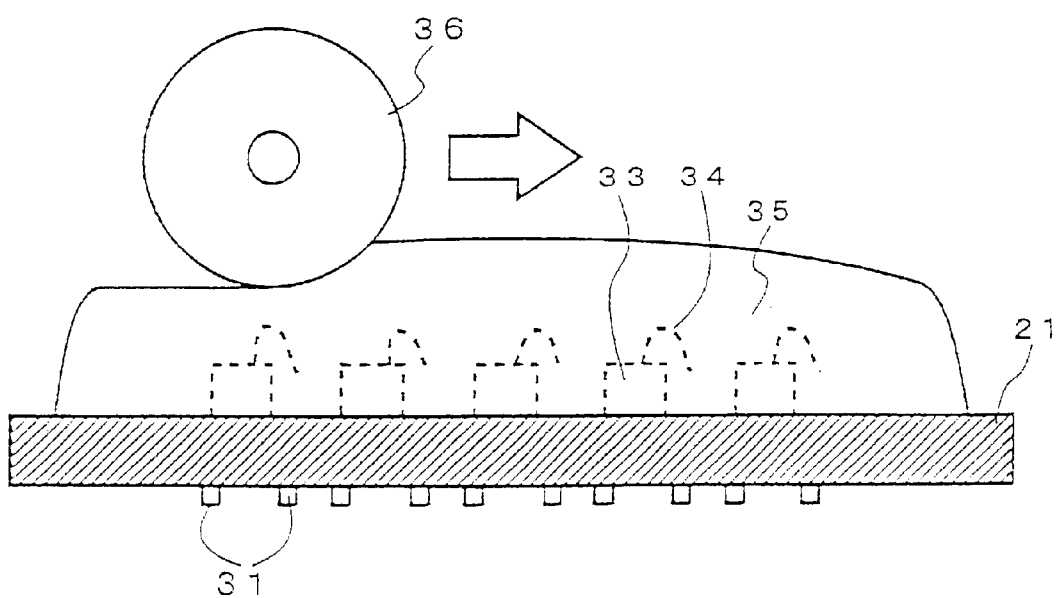

4th Step: (FIG. 7C)

After the dropped liquid resin is cured at a temperature ranging from 100 to 200 degrees for several hours, the round surface of the common resin layer 35 is cut to a flat surface by a dicing device with a dicing blade. Specifically, the round surface of the common resin layer 35 is scraped off by the dicing blade to achieve a constant height from the board 21. In this step, the thickness of the common resin layer 35 is set to 0.3–1.0 mm. The flat surface extends to the edges of the common resin layer 35 such that when outermost semiconductor chips 33 are separated into individual semiconductor devices, they have resin layer contours which meet a standardized package size requirement. Of various available dicing blades having different thicknesses, a relatively thick dicing blade is used to scrape the round surface of the common resin layer 35 repeatedly a plurality of times to develop a flat surface.

Alternatively, before the dropped liquid resin 35 is hardened, a flat member may be pressed against the round surface of the common resin layer 35 to flatten the surface into a flat and horizontal surface parallel to the board 21. Thereafter, the dropped liquid resin 35 may be hardened.

Figure 8A:
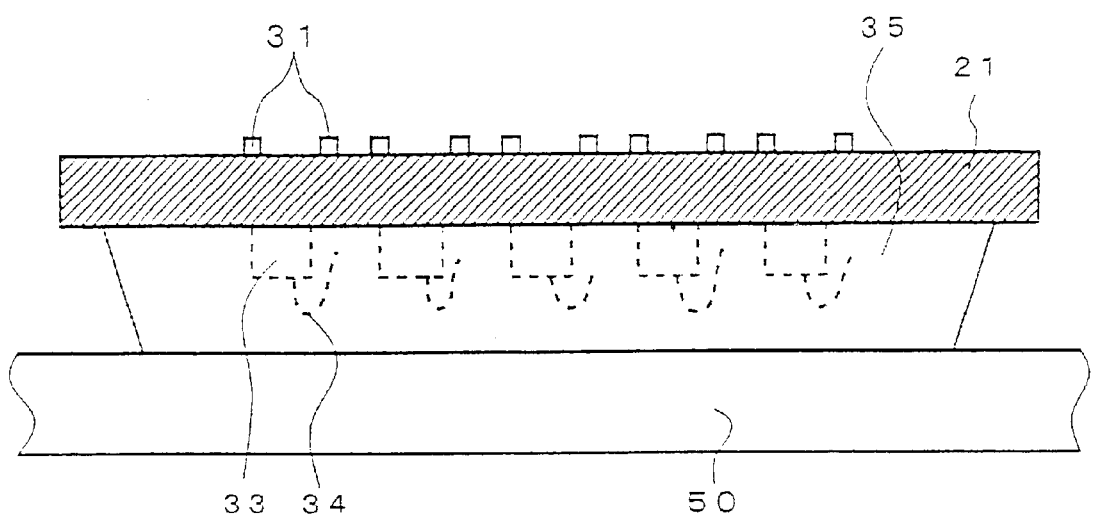
FIGS. 8A and 8B are cross-sectional views illustrative of the method of fabricating a semiconductor device according to the present invention.

5th Step: (FIG. 8A)

The board 21 is turned upside down, and a dicing sheet 50 (e.g., trade name: UV SHEET manufactured by Lintec Corp.) is applied to the surface of the common resin layer 35. Since the surface of the common resin layer 35 has been flattened into the flat and horizontal surface parallel to the board 21, the board 21 is not tilted by the dicing sheet 50 applied to the surface of the common resin layer 35, and hence is maintained at a desired level of horizontal accuracy.

Figure 8B:
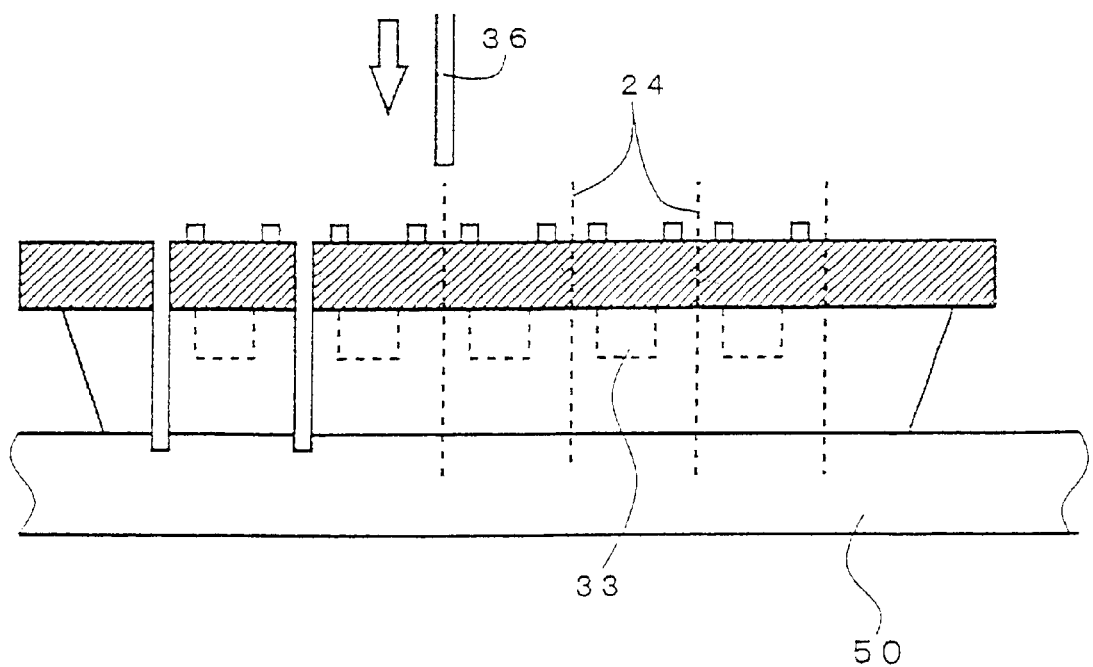

6th Step: (FIG. 8B)

The common resin layer 35 is severed into segments containing the respective device carrier areas 20 to separate individual semiconductor devices by a dicing device. Specifically, a dicing blade 36 is used to cut off the common resin layer 35 and the board 21 simultaneously along the dicing lines 24 to produce separate semiconductor devices on the respective device carrier areas 20. In the dicing process, the dicing blade 36 is thrust to such a depth as to reach the surface of the dicing sheet 50 thereby to cut off the common resin layer 35 and the board 21. At this time, the dicing device automatically recognizes alignment marks that can be observed from the back of the board 21, e.g., through holes defined in peripheral areas of the board 21 or portions of the plated layer of gold, and uses the alignment marks as a positional reference in the dicing process. The external electrodes 31a, 31b, 31c, 31d and the islands 25 are patterned such that they are held out of contact with the dicing blade 36. This is to prevent the plated layer of gold from being burred by the dicing blade 36 as much as possible in view of a relatively low level of cuttability of the plated layer of gold. Therefore, the dicing blade 36 and the plated layer of gold are brought into contact with each other at the first and second joint arms 27, 28 which are provided for electrical connection.

Figure 9A:
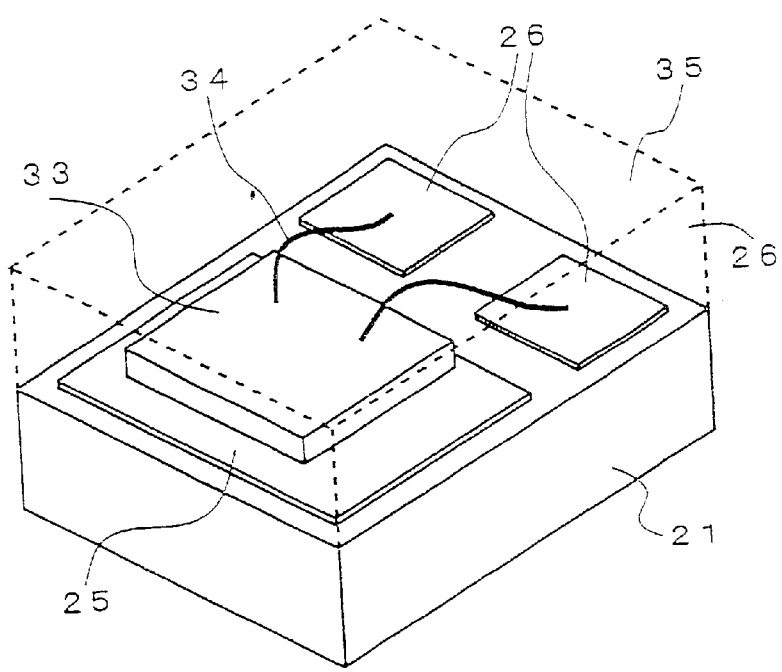
FIGS. 9A and 9B are perspective views of a semiconductor device fabricated by the method according to the present invention.
Figure 9B:
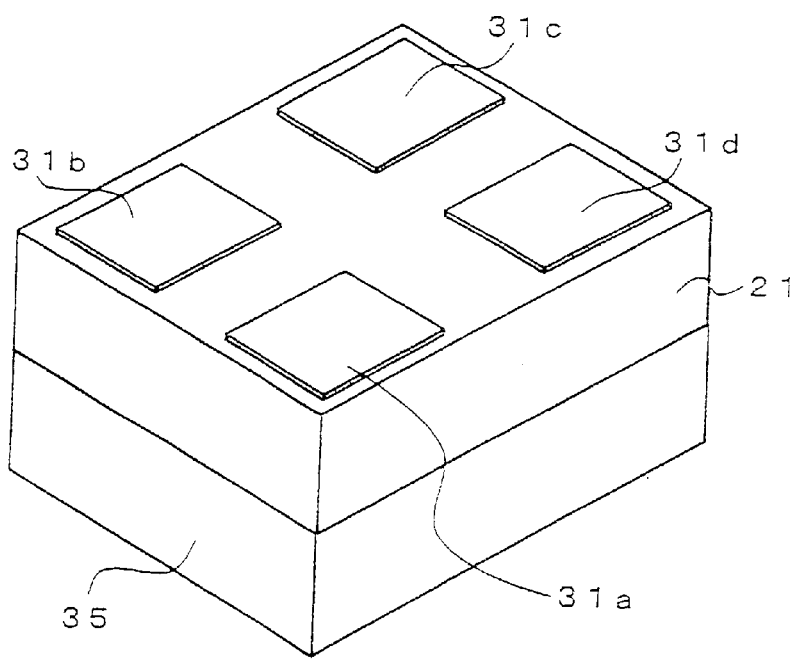

FIGS. 9A and 9B show in perspective a semiconductor device fabricated by the above successive steps.

Each package of the semiconductor device has four sides defined by cut edges of the resin layer 35 and the board 21, an upper surface defined by the flat surface of the resin layer 35, and a lower surface defined by the back of the board 21.

The semiconductor device has a size including a length of 1.0 mm, a width of 0.6 mm, and a height of 0.5 mm. The board 21 is covered with the common resin layer 35, sealing the semiconductor chip 33. The semiconductor chip 33 has a thickness of about 150 µm. The island 25 and the leads 26 are spaced or retracted from the edges of the package, with cut edges of the first and second joint arms 27, 28 being exposed on edges of the package.

The external electrodes 31a–31d are disposed at the respective four corners of the back of the board 21, and each have a size of about 0.2×0.3 mm. The external electrodes 31a–31d are vertically (horizontally) symmetrical with respect to central lines of the package contour. Since the symmetrical layout of the external electrodes 31a–31d makes it difficult to distinguish their polarities from each other, it is preferable to form recesses in or apply printed indicia to the surfaces of the external electrodes 31a–31d to provide marks indicating their polarities.

Because semiconductor devices thus fabricated are packaged together by the resin layer, the amount of synthetic resin which would be wasted and the cost of the synthetic resin used are smaller than if the semiconductor devices were individually packaged by the conventional method. As no lead frames are used, the outer profile of the package is much smaller than if the package were fabricated according to the conventional transfer molding process. Since the terminals for external connection are mounted on the back of the board 21 and do not project from the package, the package has a reduced mounting area.

In the above fabrication process, the dicing sheet 50 is applied to the common resin layer 35, rather than the board 21. If the dicing sheet 50 were applied to the board 21, the adhesive of the dicing sheet 50 would be left on the surfaces of the electrodes 31a–31d when the semiconductor devices are removed from the dicing sheet 50. If a semiconductor device with adhesive deposits left thereon were supplied to an automatic mounting apparatus, then the solderability of the electrodes 31a–31d would be impaired when the semiconductor device is mounted on a printed-circuit board. Dust particles that would tend to be applied to the electrodes 31a–31d because of the adhesive deposits would also pose a problem. According to the present invention, the above drawbacks are not present because the dicing sheet 50 is applied to the side of common resin layer 35.

Furthermore, since the dicing sheet 50 is applied to the flat and horizontal surface of the common resin layer 35, the board 21 is maintained at a desired level of horizontal accuracy which is the same as if the dicing sheet 50 were applied to the board 21.

In the illustrated embodiment, the three-terminal active component is sealed and the four external electrodes are formed. However, the principles of the present invention are also applicable to the fabrication of a semiconductor device having two sealed semiconductor chips or a sealed integrated circuitchip.

The method according to the present invention can produce a package structure which is smaller than semiconductor devices using a lead frame. Since no lead terminals project from the package, the package has a reduced mounting area and can be mounted at a high density.

The cost of the fabrication process is highly reduced because no molds with cavities are required for sealing semiconductor chips.

After the surface of the common resin layer 35 is flattened, the dicing sheet 50 is applied to the flat surface of the common resin layer 35, and then the common resin layer 35 is severed into segments containing the respective device carrier areas 20 to separate individual semiconductor devices by a dicing device. Therefore, no adhesive of the dicing sheet 50 is applied to the surfaces of the electrodes 31a–31d.

Although a certain preferred embodiment of the present invention has been shown and described in detail, it should be understood that various changes and modifications may be made therein without departing from the scope of the appended claims.

What is claimed is:

1. A method of fabricating a semiconductor device, comprising:

preparing a board with a plurality of device carrier areas thereon;

fixing semiconductor chips to said device carrier areas, respectively;

covering said semiconductor chips fixed to said device carrier areas with a common resin layer;

flattening a surface of said common resin layer;

applying a dicing sheet to the flattened surface of said common resin layer; and separating said board and said common resin layer into segments including the device carrier areas thereby to produce individual semiconductor devices by dicing from a back of said board.

2. A method according to claim 1, further comprising placing an electrode pattern serving as external electrodes of the semiconductor chips on the back of said board, said electrode pattern being spaced inwardly from dicing lines along edges of said segments so as to be kept out of contact with a dicing blade along the dicing lines.

3. A method according to claim 1, further comprising connecting an electrically conductive pattern, which is formed on a surface of said board for fixing said semiconductor chip, with another electrically conductive pattern, which is formed on the back side of said board for external connection, via through holes filled with conductive material.

4. A method according to claim 1, wherein said board is comprised of ceramics or glass epoxy.

5. A method according to claim 1, wherein said resin layer is comprised of epoxy resin.

* * * * *